United States Patent
Bates et al.

(10) Patent No.: US 11,755,894 B2
(45) Date of Patent: Sep. 12, 2023

(54) COMPUTING CIRCUITRY FOR CONFIGURATION AND OPERATION OF CELLS AND ARRAYS COMPRISING MEMRISTOR ELEMENTS

(71) Applicant: Cirrus Logic International Semiconductor Ltd., Edinburgh (GB)

(72) Inventors: Gordon James Bates, Edinburgh (GB); Toru Ido, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 654 days.

(21) Appl. No.: 16/838,495

(22) Filed: Apr. 2, 2020

(65) Prior Publication Data
US 2020/0327401 A1    Oct. 15, 2020

Related U.S. Application Data

(60) Provisional application No. 62/831,345, filed on Apr. 9, 2019.

(51) Int. Cl.
| | |
|---|---|
| *G11C 11/54* | (2006.01) |
| *G06N 3/063* | (2023.01) |
| *G11C 13/00* | (2006.01) |

(52) U.S. Cl.
CPC ............. *G06N 3/063* (2013.01); *G11C 11/54* (2013.01); *G11C 13/0069* (2013.01); *G11C 2013/0078* (2013.01)

(58) Field of Classification Search
CPC ................ G11C 11/54; G11C 13/0069; G11C 2013/0078; G11C 13/003; G11C 13/0026; G11C 13/0028; G11C 2213/77; G11C 11/5685; G11C 13/0007; G06N 3/0635; G06N 3/063

See application file for complete search history.

(56) References Cited

U.S. PATENT DOCUMENTS

| | | | |
|---|---|---|---|
| 9,785,615 B1 * | 10/2017 | Merced Grafals | ........................... G11C 13/0023 |
| 10,825,510 B2 | 11/2020 | Jaiswal et al. | |
| 11,188,825 B2 | 11/2021 | Boybat Kara et al. | |

(Continued)

OTHER PUBLICATIONS

Combined Search and Examination Report under Sections 17 and 18(3), UKIPO, Application No. GB1913857.7, dated Feb. 17, 2020.

(Continued)

*Primary Examiner* — Khamdan N. Alrobaie
(74) *Attorney, Agent, or Firm* — Jackson Walker L.L.P

(57) ABSTRACT

This application relates to methods and apparatus for computing, especially to circuitry for performing computing, at least partly, in the analogue domain. The circuitry (200) comprises a plurality of memory cells (201), each memory cell having first and second paths between an electrode (202) for receiving an input current and respective positive and negative electrodes (203) for outputting a differential-current output. Memristors (101) are located in the first and second paths. The memory cells are configured into sets (205) of memory cells, the memory cells of each said set being connected so as to provide a differential current set output that corresponds to a combination of the cell outputs of all of the memory cells of that set. For each set, at least some of the memory cells of that set are configured to receive a different input current to other memory cells of that set.

18 Claims, 7 Drawing Sheets

(56) References Cited

U.S. PATENT DOCUMENTS

| | | | |
|---|---|---|---|
| 2017/0017879 A1* | 1/2017 | Kataeva | G06F 11/0721 |
| 2020/0160160 A1* | 5/2020 | Kim | G06N 3/0635 |
| 2020/0356848 A1* | 11/2020 | Lesso | G11C 13/0069 |

OTHER PUBLICATIONS

Krestinskaya, Olga et al., "Neuro-memristive Circuits for Edge Computing: A Review", arXiv 1807 00962 v2, [cs ET] Nov. 28, 2018.

* cited by examiner

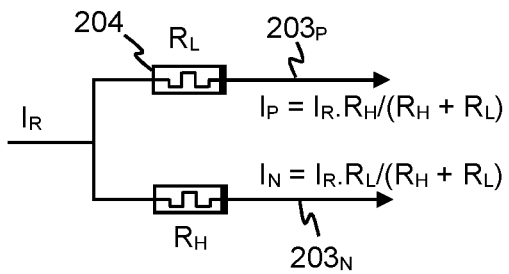
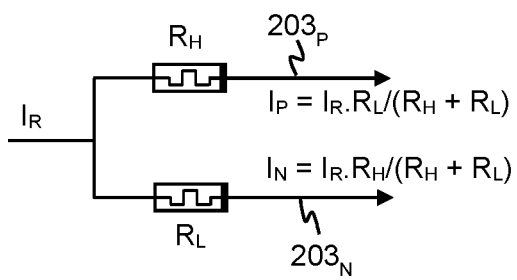
Figure 3a  Figure 3b
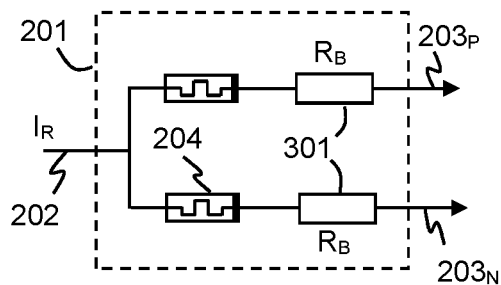
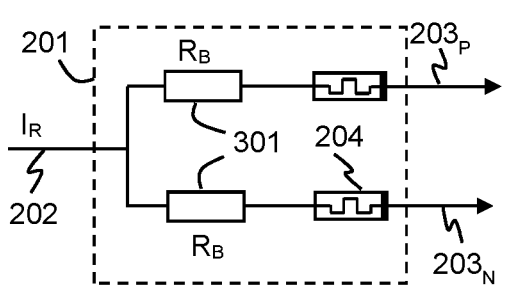
Figure 3c  Figure 3d
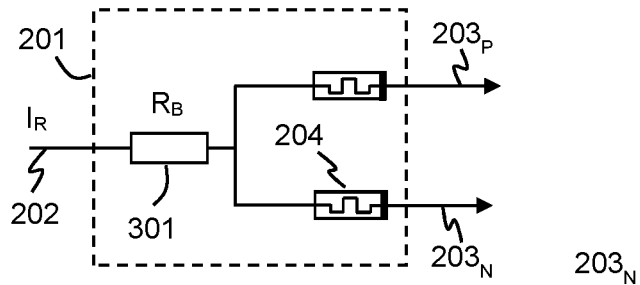
Figure 3e

COMPUTING CIRCUITRY FOR CONFIGURATION AND OPERATION OF CELLS AND ARRAYS COMPRISING MEMRISTOR ELEMENTS

The present disclosure claims priority to U.S. Provisional Patent Application Ser. No. 62/831,345, filed Apr. 9, 2019, which is incorporated by reference herein in its entirety.

FIELD OF DISCLOSURE

The field of representative embodiments of this disclosure relates to methods, apparatus and/or implementations concerning or relating to computing circuitry and, in particular, to the configuration and operation of cells comprising memristor elements for processing data, and arrays of such cells.

BACKGROUND

There are a number of applications which may, in operation, require a significant amount of computation. Computing is often performed in the purely digital domain using suitable processors, e.g. based on the Von Neumann architecture. There are some applications however where it may be advantageous to perform computation, at least partly, in the analogue domain.

For instance, artificial neural networks (ANNs) are increasingly being proposed for use in a number of different areas, e.g. for classification or recognition purposes. An ANN typically comprises a number of processing nodes or artificial neurons. Each processing node can receive a plurality of data inputs and generate an output based on a weighted combination of the data inputs and a transfer function. Typically the processing nodes may be arranged in layers and the output of a processing node of one layer may be provided to one or more processing nodes of a succeeding layer.

In order to perform a particular task, the ANN is trained using a training data set and the weights applied to the different data inputs by the various processing nodes adjusted. The goal is to determine a set of overall weights such that input data that is known to correspond to a particular defined class is correctly identified as belonging to that class and input data known not to correspond to that defined class is not incorrectly identified as such. For supervised learning, training the ANN requires use of a controlled training data set and requires a significant amount of processing. The ANN is thus typically trained in a centralised way in a suitable computing facility, e.g. a high performance server or the like.

Once trained, the ANN can be used for inference with newly acquired data, e.g. for classification or recognition purposes. In at least some approaches, the trained ANN may be hosted on a centrally accessible computing facility, e.g. a central server, and may receive and process data received from remote devices. For example, to allow for a user of a device such as a smartphone to instruct internet search queries by voice, the speech of the user could be captured by the smartphone and the relevant audio transmitted, possibly after some initial processing to extract features of interest, to an inference engine comprising an ANN trained for speech recognition which is hosted on a data centre. The ANN can then process the received audio to determine the relevant query.

In at least some instances however it may be desirable to implement the ANN for inference in the remote device itself. This may be the case to enable operation where a data connection to a central computing facility is not possible or practical. Additionally, the concept of "edge computing" moves at least some of the computational load from central computing facilities to the "edge devices", such as smartphones, tablet computers etc. that collect the relevant data to be processed. This can significantly reduce the computing burden on the central facilities.

Processing data using a trained ANN, i.e. performing inference, may involve significant computation. For an ANN, the input to each processing node is typically a vector of input variables, and the input vector may have a relatively large number of elements. For at least some ANNs the processing in each layer effectively involves multiplying the input vector by a matrix of stored weights and then combining the processed results into an output vector. The matrix of stored weights may have a large number of elements, which need to be stored in memory, and the matrix multiplication will involve a large number of calculations. Implementing a trained ANN with a digital processor based on the Von Neumann architecture, would involve the weight values being stored in memory. Performing the computation associated with operating the ANN would thus involve a large number of individual calculations, with memory reads to retrieve the relevant weight value and memory writes to store the result of the individual calculations. The computation would, in general be sequential in each processor core. This means that there may be some computational latency associated with performing the computations necessary for operating the ANN. In some applications, for instance for voice recognition, such latency may be undesirable.

Additionally, especially for portable devices, low power consumption is generally desirable. This is particularly the case where the computing may be performed as part of some function that is provided relatively continuously over a long timescale. For example it may be desirable to allow for an electronic device to operable in a mode to respond to voice commands issued at any time, without requiring the user to physically interact with the device in anyway beforehand. Such "always-on" functionality requires a microphone of the device to be active and for audio detected by the microphone to be analysed, in a substantially continuous manner, to detect any voice activity. The analysis may involve at least some processing of the audio signal which may involve significant computation, e.g. to detect whether a defined trigger word or phrase was spoken and/or to determine whether the voice activity corresponds to a registered user of the device. Implementing such processing using a conventional digital processor may require a digital processing chip to be active relatively continuously, which may result in an undesirable amount of power consumption.

SUMMARY

Embodiments of the present disclosure relate to methods, apparatus and systems for computing that at least mitigate at least some of the above mentioned issues.

According to an aspect of the disclosure there is provided computing circuitry comprising: a plurality of memory cells, each memory cell comprising:
 a first electrode for receiving an input current;
 positive and negative second electrodes for outputting a differential-current cell output;
 a first memristor in a first path connecting the first electrode to the positive second electrode; and
 a second memristor in a second path connecting the first electrode to the negative second electrode;

wherein the plurality of memory cells are configured into one or more sets of memory cells, the memory cells of each said set being connected so as to provide a differential current set output that corresponds to a combination of the cell outputs of all of the memory cells of that set; and wherein, for each said set, at least some of the memory cells of that set are configured to receive a different input current to other memory cells of that set.

In some examples, for each set, each memory cell of that set is configured to receive a different input current to the other memory cells of that set.

Note, as used herein, when the description refers to the presence of one or more items, e.g. one or more sets, the term "each" used in relation to those items shall be taken as meaning the relevant item if there is only one such item, or the plurality of items if there are a plurality. In other words the use of term each does not, by itself, imply that there is a plurality of such items.

In some implementations the circuitry may further comprise at least one series of current sources, each series of current sources being configured to provide input currents for at least one set of memory cells.

The circuitry may further comprise at least one time encoding modulator operable to apply a time-encoding modulation, based on an input data value, to a set of memory cells so as to provide a respective modulated set output for that set of memory cells, in which an average value of the modulated set output over a defined period is proportional to the magnitude of the input data value. The time encoding modulator may, for example, be configured to apply a time-encoding modulation to a said of memory cells by modulating at least one of: the input current for each memory cell of that set of memory cells; the cell output from each memory cell of that set of memory cells; and the set output from that set of memory cells. The time encoding modulator may, in some implementations, comprise a PWM modulator.

In some implementations the computing circuitry may comprise at least one group of a plurality of sets of memory cells. For each of the sets in a group, a respective time encoding modulator may be operable to apply a time-encoding modulation based on a respective data input value. The plurality of sets of memory cells in a group may be connected so as to provide a differential current group output that corresponds to a combination of all of the modulated set outputs of the sets of memory cells of the group. In some implementations, for each set in a group, the first electrode for each memory cell in that set is connected to the first electrodes of corresponding memory cells in the other sets in that group.

In some embodiments there may be a plurality of such groups, and the computing circuitry may be configured such that, each of the sets of a group has a corresponding set in each of the other groups and the time encoding modulation applied to each corresponding set is based on the same input data value. The computing circuitry may be configured to operate at least some of the different groups simultaneously. The computing circuitry may be configured to operate at least some of the different groups sequentially.

The computing circuitry may comprise an accumulator operable to integrate the differential current group output from a group over a predefined time period. In some embodiments the computing circuitry may comprise a non-linear function generator for applying a defined non-linear function to the accumulator.

In some examples, the non-linear function generator may comprise a current mode digital to analogue converter configured to generate a current based on a target current control signal, wherein the target current control signal varies over time according to the predefined non-linear function. In such a case the accumulator may be configured to operate in a first phase and a second phase, wherein: in the first phase the accumulator is configured to receive and integrate the differential current group output from a said group over a predefined time period; and in the second phase the accumulator is configured to receive and integrate the current output from non-linear function generator and to determine a duration from the start of the second phase until the integrated current in the second phase has the same magnitude as the integrated current in the first phase. The accumulator may be configured to output an accumulator output value based on the determined duration in the second phase. The accumulator may, in some examples, be configured to charge or discharge a storage element during the first phase so as to vary a voltage level of the storage element from a first defined voltage level and to discharge or charge the storage element during the second phase until the voltage level of the storage element reaches the first defined voltage level.

In some implementations the computing circuitry may further comprise a programming controller for controlling programming of the plurality of memory cells such that, for each said set of memory cells, the differential current set output is proportional to a respective stored data value.

In some embodiments the programming controller is configured to program the memory cells according to a binary coding scheme. The computing circuitry may thus be configured such that the input currents provided to different memory cells of a said set of memory cells are binary weighted. The programming controller may be configured to program the memory cells to either of: a first cell state, in the first memristor is programmed to a low resistance state and the second memristor is programmed to a high resistance state; or a second cell state, in the first memristor is programmed to the resistance state and the second memristor is programmed to the low resistance state.

In some embodiments the programming controller is configured to program the memory cells according to a ternary coding scheme. The computing circuitry may be configured such that the input currents provided to different memory cells of a said set of memory cells are ternary weighted. The programming controller may be configured to program the memory cells to any of: a first cell state, in the first memristor is programmed to a low resistance state and the second memristor is programmed to a high resistance state; a second cell state, in the first memristor is programmed to the resistance state and the second memristor is programmed to the low resistance state; or a third cell state, in which both the first and second memristors are programmed to the same one of either the low resistance state or the high resistance state. In one example, in the third cell state both of the first and second memristors are programmed to the high resistance state, and the programming controller is configured such that each memory cell may be further controllably programmed to a fourth cell state, in which both the first and second memristors are programmed to the low resistance state. In some examples of the computing circuitry, for any collection of memory cells which are connected to one another by their first electrodes, the programming controller may be configured to program the collection of memory cells such that any imbalance in the number of instances of the third cell state and the fourth cell state is below a defined limit.

In some embodiments the programming controller is configured to program each memory cell to a selected one of at least: a first cell state in which the first and second memristors are programmed such that the first and second paths have respective resistances so as to steer current from the first electrode to the positive and negative second electrodes to provide a differential current of a first polarity and a first magnitude with respect to the input current; a second cell state in which the first and second memristors are programmed such that the first and second paths have respective resistances so as to steer current from the first electrode to the positive and negative second electrodes to provide a differential current of a second, opposite, polarity and the first magnitude with respect to the input current; a first additional cell state in which the first and second memristors are programmed such that the first and second paths have respective resistances so as to steer current from the first electrode to the positive and negative second electrodes to provide a differential current of the first polarity and of a second magnitude with respect to the input current, where the second magnitude is a defined fraction of the first magnitude; and a second additional cell state in which the first and second memristors are programmed such that the first and second paths have respective resistances so as to steer current from the first electrode to the positive and negative second electrodes to provide a differential current of the second polarity and of the second magnitude with respect to the input current.

In some implementation at least some memory cells may further comprise one or more ballast resistances, each of the first and second memristors being coupled in series with at least one of said ballast resistances.

The computing circuitry may be implemented as at least part of an artificial neural network. Embodiments also relate to an artificial neural network apparatus comprising computing circuitry as described in any of the variants herein. Embodiments also relate to an electronic device comprising computing as described in any of the variants herein. The device may be at least one of: a battery powered device; a portable device; a communications device; a smartphone; a computing device; a laptop, notebook or tablet computing device; a wearable device; a smartwatch; a voice controlled or activated device; a smart speaker; a domestic appliance.

In another aspect there is provided a computing apparatus comprising:
  a plurality of memory cells, each memory cell comprising first and second memristors for collectively storing a data digit, the first and second memristors being coupled between an input electrode and respective output electrodes;
  wherein the plurality of memory cells are configured into a plurality of sets for storing a multi-digit data value and, in use, outputting an output signal proportional to the stored multi-digit data value for that set;
  a plurality of modulators for applying a PWM modulation to a said set based on an input data value, so as to provide a modulated set output signal proportional to both the relevant stored multi-digit data value and the input data value;
  wherein the plurality of sets are configured into at least one group for proving a group output corresponding to the combination of the modulated set output for each set in the group; and an accumulator for integrating the group output over a PWM cycle period.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which:

FIGS. 3a and 3b illustrate first and second cell states of a memory cell, and FIGS. 3c to 3e illustrate other examples of memory cells;

DETAILED DESCRIPTION

Figure 1:
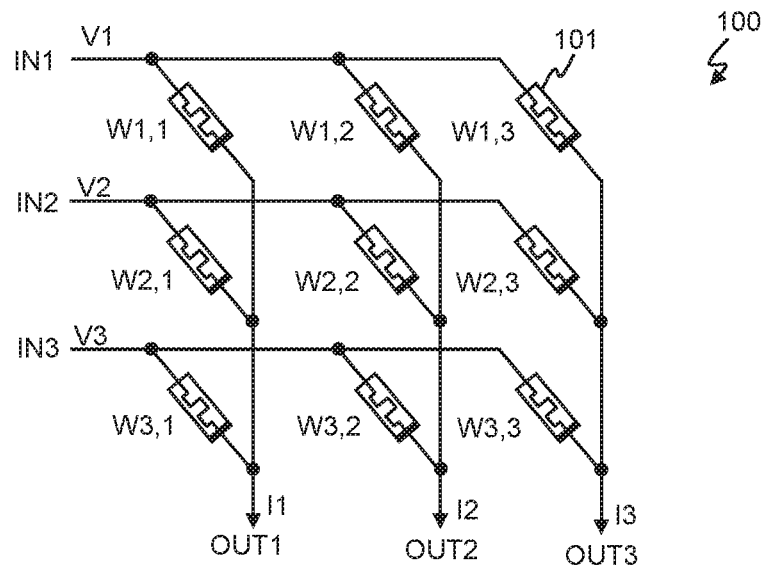
FIG. 1 illustrates a known memristor crossbar array.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above artificial neural networks (ANNs) are one example of an application that may involve significant computation, for instance matrix multiplication, during operation and, for which, conventional digital processing based on the Von Neumann architecture may have disadvantages in terms of processing throughput and/or power consumption.

It has been proposed that at least some of the computation associated with an ANN, e.g. when using the ANN for inference, may be implemented using computing in the analogue domain, for instance using a crossbar array comprising memristors.

The term memristor is used herein to refer to an electronic element that has a variable resistance which can be controlled or varied and which has some memory such that a particular resistance state persists in the absence of applied power. Binary memristor elements have been proposed, for instance based on MRAM (Magnetoresistive random-access memory) or ReRAM (Resistive random-access memory) memory, that can exhibit either a high resistance state or a low resistance state and can be selectively programmed to operate in the desired state, for instance by applying suitable programming voltages. The programmed state may persist, in the absence of any applied power, and thus the memristor can be seen as non-volatile memory which can be read by determining whether the element is in the high resistance or the low resistance state. An individual MRAM or ReRAM memory or memristor element may thus be used as binary memory element.

Memristor crossbar arrays have been proposed for use as memory arrays. Such arrays may have a plurality of first electrodes arranged to overlap with a plurality of second electrodes, e.g. row electrodes and column electrodes. Each of the row electrodes is coupled to each of the second electrodes, e.g. column electrodes via a respective memristor. To program the array, suitable programming voltage pulses may be applied to each of the column electrodes, with a write voltage applied to one of the row electrodes, so as to create a resultant voltage to suitably program each of the memristors associated with that row. The other row electrodes may be held at a voltage level such that the resultant voltage experienced by the memristors of these other row is insufficient to change the resistance state of the memristor. The array may be programmed in this way, row by row. Once programmed, the memory can be read out, row by row, by applying a read pulse to the relevant row and monitoring each column to determine the resistance state of the relevant memristors.

It has been proposed that a memristor crossbar array of this type could also be used to provide some computation.

FIG. 1 illustrates the principle. FIG. 1 illustrates a three-by-three crossbar array 100 with, in this example, three row electrodes arranged as inputs IN1, IN2, IN3 and three column electrodes arranged as outputs OUT1, OUT2, OUT3. It will be understood however that the principle could apply to a different number of inputs and/or outputs and the number of inputs could be different to the number of outputs. Each input is connected to each output via a respective memristor 101.

In the example of FIG. 1, input data may be provided to each input of the array as a respective voltage level, V1, V2, V3. Each output will provide a respective output current I1, I2, I3. A given output will receive a contribution of current from each input, where the respective current contribution depends on the respective voltage at that input and the resistance state of the relevant memristor. Simplistically, if each output were considered to be held at ground or be a virtual earth, the current contribution at a given output k from a given input j will be equal to the voltage Vj at input j multiplied by the conductance Gj,k of the memristor linking input j to output k (and where the conductance Gj,k is the inverse of the resistance of the relevant memristor, i.e. Gj,k=1/Rj,k where Rj,k is the resistance of the relevant memristor). In this example a given output thus receives a contribution to the overall current output current from each input, where the current contribution is equal to the product of the voltage at that input and the conductance of the relevant memristor. The overall current output may be regarded as representing the dot product Gk.V=ΣGj,k·Vj of a vector V comprising the set of voltages Vj with a vector Gk comprising the set of conductances {Gj,k; j=1 . . . }.

The conductance Gj,k of the memristor, i.e. 1/Rj,k, can thus be seen as a weight Wj,k applied to the data at input j for output k. If suitable data is applied simultaneously to multiple inputs, the output current at a given output is a sum of the weighted contributions from the various inputs. This output current could be processed as an analogue current variable or converted into a corresponding voltage. It can therefore be seen that the crossbar array illustrated in FIG. 1 performs simultaneous dot product calculations for the various input data values with stored weight values, without requiring a separate memory read process and automatically provides a sum of the relevant weighted input values for a given output.

It will be understood that in the example of FIG. 1 there is a single two-level memristor connecting each input to each output and, as such, the stored weight may take only two different values. In practice it may be desirable to provide a greater resolution for the different weighing values. Additionally the arrangement illustrated in FIG. 1 only allow for a unipolar weighting. In some applications it may be desirable to provide bipolar weightings, i.e. for weightings to have positive or negative values.

Embodiments of the present disclosure relate to methods, apparatus and/or implementations concerning or relating to computing circuitry comprising memristor elements. In particular, embodiments relate to circuitry cells comprising memristor elements for storing and outputting multilevel data values, e.g. multilevel weighting values. At least some embodiments relate to circuitry for storing a multilevel data value and outputting a current signal representing that data value, e.g. a weighting signal. In some embodiments the multilevel data value may be stored as a bipolar value.

Figure 2:
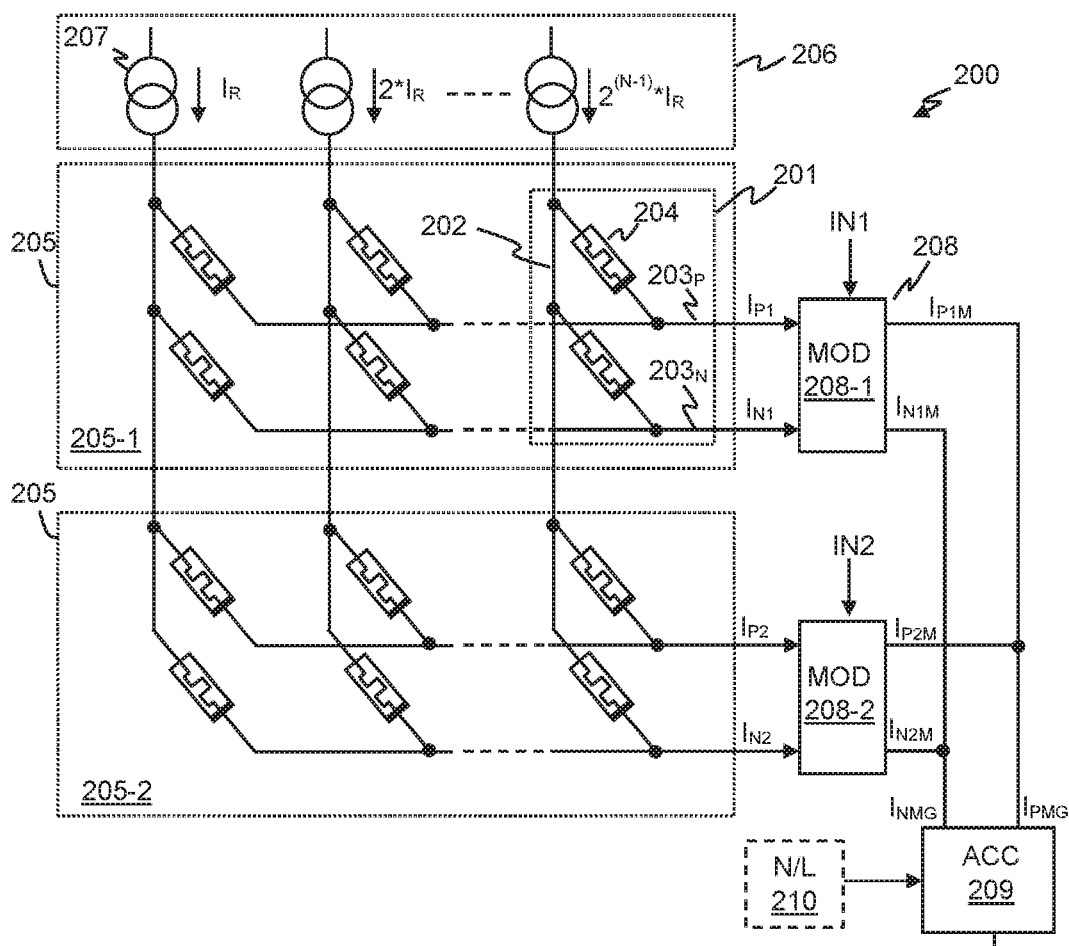
FIG. 2 illustrates computing circuitry according to an embodiment including sets of memory cells comprising memristors.

FIG. 2 illustrates one example of computing circuit 200 according to an embodiment. The circuit 200 comprises a plurality of memory cells 201.

Each memory cell 201 comprises a first electrode 202 for receiving, in use, a defined input current. Each memory cell 201 also comprises two second electrodes $203_P$ and $203_N$ for outputting a differential current output. The second electrodes will be referred to herein as positive and negative electrodes respectively, although it will be understood that this does not imply anything about any direction of current flow in either electrode. The first electrode 202 is coupled to each of the two second electrodes $203_P$ and $203_N$ via first and second paths, each comprising a respective memristor 204. The memristors 204 of a memory cell are the same as one another, i.e. have substantially the same structure and properties.

The memory cells 201 are arranged into at least one set 205 having a defined number, N, of memory cells 201 where the differential current output from each of the N memory cells in the set are combined together. In other words, the second electrodes $203_P$ and $203_N$ of the N memory cells forming a set may, in use, be connected together. For example, as illustrated in FIG. 2 the positive and negative electrodes $203_P$ and $203_N$ may be common to each of the N memory cells in a set. In other arrangements, the positive and negative electrodes of each of the N memory cells may be connected to respective common positive and negative electrodes, e.g. positive and negative buses for the set, possibly via some switch arrangement as will be discussed later. Each set 205 of N memory cells is also coupled, via the respective first electrodes 202, to a series 206 of current sources 207. In the example of FIG. 2 each memory cell 201 of a set 205 is arranged to receive, in use, a different defined current via its first electrode 202. In the example illustrated in FIG. 2 each memory cell 201 of the first set 205 is coupled to a respective current source 207, although in some embodiments a given current source may be shared with multiple memory cells in parallel to divide the current between the memory cells.

As will be set out in more detail below, the differential current output from a given memory cell 201 will depend on the resistance states of the memristors 204 of the memory cell, but may, in at least some states of the memory cell, also be proportional to the defined current received by the relevant memory cell 201. If each memory cell 201 of a set 205 is arranged to receive a different defined current, the memory cells can be programmed to suitable respective states so that the set of cells effectively stores a multilevel data value, e.g. a weight value that can take more than two different values.

In some embodiments the defined currents provided to the memory cells of a set 205 may be binary weighted such that a defined current provided to one memory cell varies from the defined current provided to another memory cell by a factor of two. FIG. 2 illustrates that a defined current $I_R$ may be provided to a first electrode of a first memory cell of the set 205, with the defined current supplied to the first electrodes of successive memory cells being doubled so that the current supplied to the Nth memory cell of the set 205 is equal to $2^{(N-1)}*I_R$. The N memory cells of the set 205 may then be programmed to store bit values of a multibit data value, e.g. a multibit weight value. In this example the first memory cell, which receives the lowest value of defined current, may be seen as representing the least significant bit (LSB) with the Nth memory cell, which receives the largest current value, representing the most significant bit (MSB).

In some embodiments a memory cell 201 may be programmed to store a bit value by programming one of the memristors 204 of the memory cell to the high resistance state and the other memristor to the low resistance state. In such an embodiment each memory cell is thus programmable to adopt either a first cell state or a second cell state. In the first cell state, the memristor in the first path connecting the first electrode 202 to the positive output electrode $203_P$ is in the low resistance state and the other memristor, in the second path connecting the first electrode 202 to the negative output electrode $203_N$ is in the high resistance state. The second cell state is the opposite configuration, with the memristor in the first path connecting the first electrode 202 to the positive output electrode $203_P$ in the high resistance state and the other memristor, in the second path connecting the first electrode 202 to the negative output electrode $203_N$ is in the low resistance state. This has the advantage that the overall resistance of the memory cell 201 will effectively be the same in each of the first and second cell states, which may be advantageous if a current source 207 of the series of current sources is arranged to provide current for a plurality of different sets of memory cells.

For example, FIG. 2 illustrates that both a first set 205-1 of memory cells and a second set 205-2 of memory cells receive defined currents from the same series 206 of current sources. In this example the inputs of the memory cells of the second set 205-2 are connected to the inputs of the corresponding memory cells of the first set 205-1, e.g. the first electrode 202 may be common to the corresponding memory cells in the various sets. Again however other arrangements are possible and the first electrode of each memory cell could be coupled to a respective current bus connected to the relevant current source. In any case, it will be appreciated that the current will be divided between the relevant memory cells of the different sets, but as noted, if each memory cell of each set has the same general configuration and each memory cell is always switched to a cell state with one memristor in the high resistance state and one memristor in the low resistance state then the current should be divided substantially equally between the memory cells of the different sets (ignoring losses in the conductive tracks etc.), and the defined current steered through each memory cell 201 is effectively scaled by a factor relating to the number of memory cells connected to the same current source. FIG. 2 illustrates a group of just two sets 205-1 and 205-2 for clarity but it will be understood that there may be many more sets 205 of memory cells connected to a given series 206 of current sources in practice.

The resistance state of the memristors of a given memory cell 201 will selectively steer current preferentially to the positive electrode $203_P$ or the negative electrode $203_N$. FIGS. 3a and 3b illustrate this principle. FIG. 3 illustrates two memristors 204 of a single memory cell and assumes that all of a defined reference current $I_R$ is applied to the common first electrode and steered to the second electrodes $203_P$ and $203_N$ via the first and second paths. FIG. 3a shows the first cell state where the memristor connected to the positive electrode $203_P$, i.e. in the first path, is in the low resistance state, with a resistance $R_L$, and the memristor connected to the negative electrode $203_N$, i.e. in the second path, is in the high resistance state, with a resistance $R_H$. In this case a greater amount of current will be steered to the positive electrode $203_P$. In this case the currents $I_P$ and $I_N$ of the positive and negative electrodes $203_P$ and $203_N$ will, in the ideal case, be equal to:

$$I_P = I_R \cdot R_H/(R_H+R_L) \quad I_N = I_R \cdot R_L/(R_H+R_L) \qquad \text{Eqn. (1)}$$

FIG. 3b shows the second, opposite, cell state, where the memristor connected to the positive second electrode $203_P$ is in the high resistance state, with a resistance $R_H$ and the memristor connected to the negative second electrode $203_N$ is in the low resistance state. In this case the values of the positive and negative currents will be reversed. The difference between the currents, $\Delta I = I_P - I_N$ will be substantially equal and opposite in the two cases and will be equal to:

$$\Delta I = I_P - I_N = \pm I_R[(R_H - R_L)/(R_H + R_L)] \qquad \text{Eqn. (2)}$$

$$= \pm I_R \cdot A_R \qquad \text{Eqn. (3)}$$

where $A_R$ is a constant (given by the term in square bracket in equation 2) which is related to the difference between the difference in resistance in the two different resistance states of the memristors.

It will be seen that the individual currents $I_P$ and $I_N$ of the positive and negative electrodes, and the resultant difference current, are proportional to the value of the reference current $I_R$ in each of the first and second cell states of the memory cell 201. The first cell state can thus be seen as equivalent to a data value of +1 and the second cell state can thus be seen as equivalent to a data value of −1.

Referring back to FIG. 2, it will thus be understood that the current contributions to the positive electrode $203_P$ from the memory cells 201 of the set 205 of N connected memory cells will sum together, as will the current contributions to the negative electrode $203_N$. In effect, each memory cell 201 will contribute a differential current component that is proportional to the defined current supplied to the memory cell and the constant $A_R$.

For example consider that the set 205 of memory cells comprises four memory cells, with binary weighted currents such that a defined current of $I_R$ is supplied to the first cell of the set 205, i.e. the LSB, and a defined current of $8*I_R$ is supplied to the fourth memory cell, i.e. the MSB. If each of the memory cells steers all of the received current to its positive and negative electrodes $203_P$ and $203_N$, the differential current contribution from the Nth memory cell will be equal to:

$$\Delta I = \pm 2^{(N-1)}*I_R*A_R \qquad \text{Eqn. (4)}$$

Depending on the cell states of the four memory cells the differential current output could take any one of sixteen different values ranging from $+15I_R*A_R$ to $-15I_R*A_R$ in steps of $2I_R*A_R$.

It will be appreciated however that any mismatch between the resistance states of the memristors of one memory cell compared to another memory cell may result in a mismatch in the current steering provided by those memory cells. As explained with reference to equations 2 and 3, the constant $A_R$ is equal to $(R_H-R_L)/(R_H+R_L)$. If the values of $R_H$ and/or $R_L$ vary from one memory cell to another, the relevant constants $A_R$ may vary between the memory cells, which may introduce an error between memory cells with regard to the respective differential output currents. In particular the memory cells may be sensitive to any variations in the resistance $R_L$ of the low resistance state.

In some implementations any variation between the various memristors may be sufficiently low for the accuracy required. In some embodiments however it may be desirable to reduce the sensitivity to any part-to-part variations in memristor resistance. In some embodiments therefore each of the memristors 204 of a memory cell may be connected in series with an additional resistance, e.g. a suitable resistor.

For example, FIG. 3c illustrates an example of a memory cell where a respective resistance 301, which may be seen as a ballast resistance with a resistance value $R_B$, is connected in series with the respective memristor 204 in each of the first path between the first electrode 202 and the positive second electrode $203_P$ and the second path between the first electrode 202 and the negative second electrode $203_N$. In this case the resistance of the first path, or the second path, when the respective memristor is in the high resistance state will be $R_H+R_B$ and will be $R_L+R_B$ when the respective memristor is in the low resistance state. The resistance $R_B$ may advantageously be chosen to be greater than $R_L$ but lower than $R_H$ so that the resistance of a path when the relevant memristor is in the low resistance state is dominated by $R_B$ but the resistance of the memristor in the high resistance state is greater. The effect of such a ballast resistance is to reduce the sensitivity of the memory cells to any variation in the resistances of the memristor states, in particular any variation in the resistance of the low resistance state.

FIG. 3c illustrates that the resistance 301 is on the output side of the memristor 204 in the respective path, but equally, in one or both paths, the resistance 301 could be connected on the input side, as illustrated in FIG. 3d.

Additionally or alternatively a resistance 301 could be shared between the first and second paths as illustrated in FIG. 3e, which may reduce the number of components required and allow for a memory cell to have a small size. In the example of FIG. 3e the resistance 301 is located in a common path, with the first and second paths, with their respective memristors, branching from the common path to the relevant second electrodes $203_P$ and $203_N$. This configuration is advantageous in configurations as illustrated in FIG. 2 where the inputs of multiple memory cells 201 are supplied with current from a common current source. With no ballast resistor, each memory cell provides an impedance of RH/RL, so any mismatch from cell to cell of the programmed values of RH and RL affects how the sources current is split between different cells, modifying the effective weighting applied by each cell. Adding a shared ballast resistor 301 in series with each memristor pair reduces this effect.

It will be understood however that FIGS. 3c to 3e illustrate just three examples and many other arrangements are possible and may be implemented.

In the case described above, where the various memory cells of a set are provided with binary weighted currents, each individual memory cell 201 can be seen as being a bitcell, i.e. a memory cell for storing an individual bit of the stored data word i.e. weight value, with the set 205 of N memory cells together collectively storing a data word, i.e. N bit weight value.

A set 205 of N memory cells 201 together with the series 206 of current sources 207 can be seen as providing the functionality of a current-mode digital-to-analogue converter (IDAC) with a differential current mode output. Such a current mode DAC, with memristors providing current steering, represents a novel aspect of this disclosure.

The differential current generated by a set 205 of memory cells, i.e. the differential current set output, is thus representative of the data word, e.g. weight value, stored by that set 205 of memory cells 201.

To enable a computing function, for instance to determine a product based on the weight value and a data input value, the computing circuit may comprise a modulator 208 for modulating the differential current signal output from the set 205 of memory cells based on the data input. FIG. 2 illustrates that each set of memory cells 205-1 and 205-2 may provide a differential current set output to a respective modulator 208-1 and 208-2 which each receives respective input data IN1 and IN2.

The modulator 208 may comprise a modulator suitable for time-encoding the differential current signal, for instance for applying a PWM (pulse-width-modulation) modulation to the current signal components. The modulator 208 may, for example, be configured to pass the received differential current signal to the output of the modulator for a proportion of a PWM cycle period defined by the input data IN, and to effectively output a zero differential current component for the rest of the PWM cycle period. Thus the current signal components input to the modulator 208, e.g. $I_{P1}$ and $I_{N1}$, may be converted to PWM encoded current signal components $I_{P1M}$ and $I_{N1M}$ output from the modulator 208. The output, $I_{P1M}$ and $I_{N1M}$, is thus a modulated set output for that set of memory cells.

Figure 4:
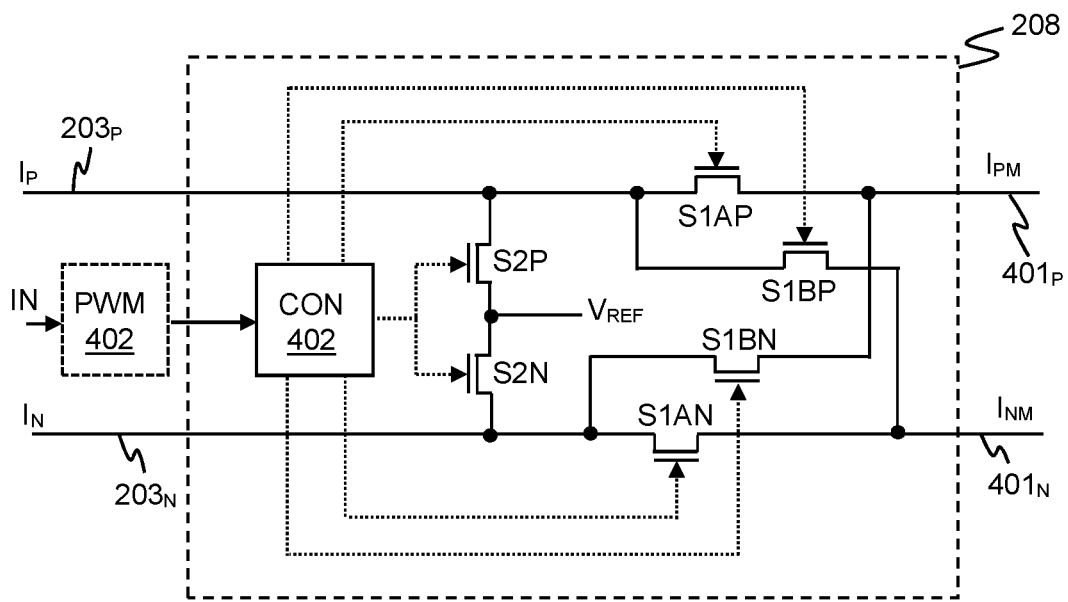
FIG. 4 illustrates an example of a suitable modulator for modulating a differential current signal output from a set of memory cells.

FIG. 4 illustrates one example of a suitable modulator 208. The modulator 208 comprises a first pair of output path switches S1AP and S1AN for selectively connecting the positive and negative electrodes $203_P$ and $203_N$ to positive and negative outputs $401_P$ and $401_N$ respectively. In the example of FIG. 4, to allow for negative data input values, the modulator 208 also comprises a second pair of output path switches, which comprises switch S1BP for connecting the positive electrode $203_P$ to the negative output $401_N$ and switch S1BN for connecting the negative electrode $203_N$ to the positive output $401_P$. The modulator 208 in the example of FIG. 4 also comprises a pair of sink switches S2P and S2N for selectively coupling the positive and negative electrodes $203_P$ and $203_N$ to a defined reference voltage $V_{REF}$. A switch controller 402 receives an input signal indicative of the input data and generates suitable switch signals for controlling the switches.

The switch controller 402 operates, in use, to enable, i.e. turn on, one of the pairs of output path switches for a first period within a PWM cycle period where the duration of the first period is determined based on the magnitude of the input data. In one implementation the pair of sink switches (S2P and S2N) may be enabled in antiphase with the relevant pair of output path switches, i.e. at the end of the first period, to connect the positive and negative electrodes $203_P$ and $203_N$ to a defined reference voltage $V_{REF}$ to sink the currents $I_P$ and $I_N$ during the rest of the PWM period.

This ensures that current continues to flow through the memory of cells of the set 205 but ensures no differential current contribution to the outputs $401_P$ and $401_N$.

Preferably downstream circuitry which accepts the currents from outputs $401_P$ and $401_N$ is configured to maintain the voltage at these output nodes equal to the reference voltage $V_{REF}$ to avoid any disturbance in voltage on inputs $203_P$ and $203_N$ from affecting the currents through the memristors. For example the outputs $401_P$ and $401_N$ may be connected to the inputs of a cascode or regulated cascode or a low-impedance current conveyor input or an op amp virtual earth.

In such an implementation the first pair of output path switches (S1AP and S1AN) may be enabled during the first period for input data of one polarity and the second pair of output path (S1BP and S1BN) switches may alternatively be enabled for input data of the opposite polarity.

Figures 5A, 5B:
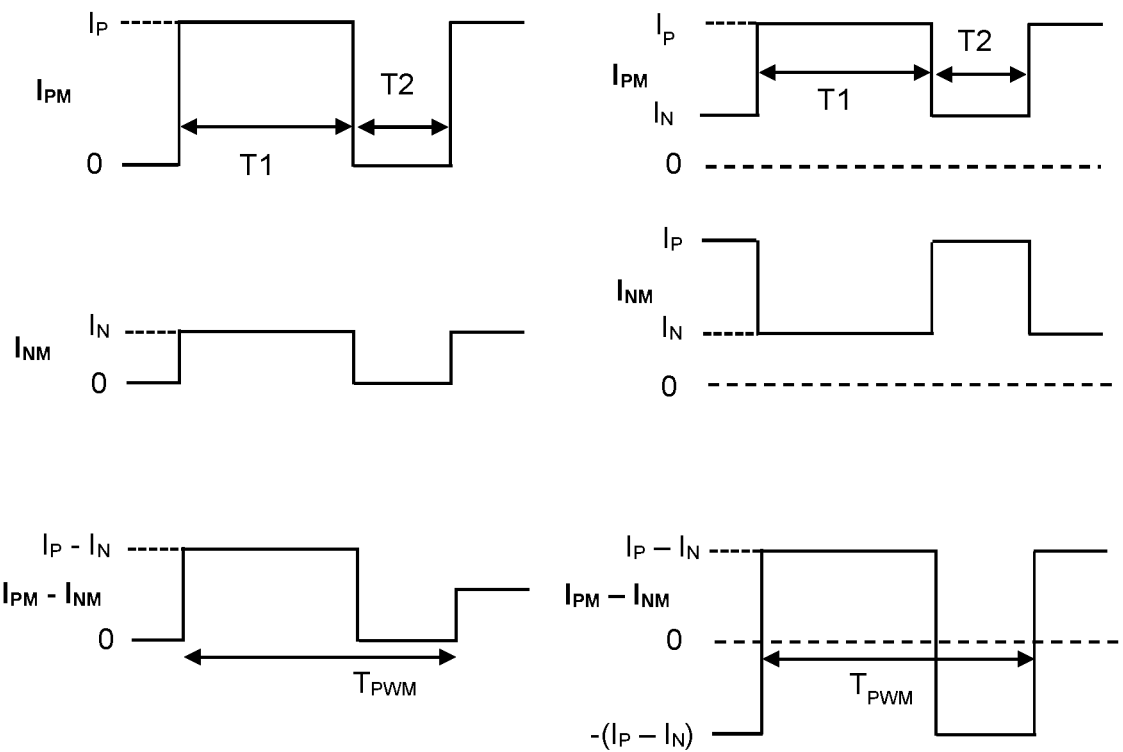
FIGS. 5a and 5b illustrate two examples of PWM encoding of the differential current signal.

In this implementation the output from the modulator 208 is thus a time-encoded, e.g. a PWM encoded, differential current signal, as illustrated in FIG. 5a. FIG. 5a illustrates the modulated set output current $I_{PM}$ at the positive output $401_P$ in the upper plot and the modulated set output current $I_{NM}$ at the negative output $401_N$ in the lower plot. During a first period T1 of the PWM cycle period $T_{PWM}$ the outputs from the modulator have the same magnitude as the currents $I_P$ and $I_N$ received at the inputs. The output from the modulator will thus be a differential current that is substantially the same magnitude as the input $I_P$–$I_N$, i.e. as defined by the weight value stored by the relevant set 205 of memory cells. In the example illustrated in FIG. 5a the positive and negative input currents $I_P$ and $I_N$ are supplied to the positive and negative outputs respectively, e.g. by enabling the first pair of output path switches S1AP and S1AN during the first period T1, which could correspond to a positive value data input. For a negative data value the magnitudes of the modulated currents $I_{PM}$ and $I_{NM}$ may be swapped during the first time period T1, e.g. by instead enabling the second pair of output path switches S1BP and S1BN. During the rest of the PWM cycle period $T_{PWM}$, i.e. during a second time period T2, the pair of sink switches are enabled and no output current is supplied and the differential current component is zero. The duration of the first period T1, as a proportion of the PWM cycle period $T_P$WM, is thus proportional to the magnitude of the input data. In other words the magnitude of the input data is encoded as T1/(T1+T2), so the duration of the first period, as a proportion of the PWM cycle period, e.g. from 0% to 100% encodes the magnitude of the input data normalised to a range of 0 to 1, and the selected pair of output path switches encodes the polarity of the input data. Thus the average current, or alternatively the total charge output from the modulator, during the PWM cycle period, is thus proportional to the product of the input data value and the weight value stored in the relevant set 205 of memory cells.

In another implementation one pair of the output path switches, e.g. S1AP and S1AN may be enabled during the first period T1 and the other pair of input path switches, e.g. S1BP and S1BN, may be enabled during the rest of the PWM cycle period, i.e. during the second period, as illustrated in FIG. 5b. Thus, during the first time period the received current $I_P$ may be provided to the positive output electrode $401_P$ and the received current $I_N$ provided to the negative output electrode $401_N$ as discussed above. However during the second time period, instead of outputting zero current, the second pair of output path switches are enabled to provide the current $I_N$ to the positive output electrode $401_P$ and the current $I_P$ to the negative output electrode $401_N$. This can provide a larger signal swing for the output difference signal. In this case the input data is encoded by the relative durations of the first and second time period T1 and T2, i.e. the data is encoded as (T1−T2)/(T1+T2). Given the differential output current is equal but opposite in the first and second time periods, a duty cycle of 50%, i.e. when T1 is the same duration as T2, would provide zero average differential output current over the PWM cycle. In this case both the magnitude and polarity of the input data can be encoded by the relative durations of the first and second time periods T1 and T2. In this implementation the pair of sink switches S2P and S2N could be omitted if desired, although it may be advantageous in some instances to include such switches so as to be able to connect the positive and negative electrodes $203_P$ and $203_N$ to a defined reference, e.g. to stabilise or reduce transients at certain times.

In some embodiments the switch controller 402 may itself function as a PWM encoder. In other words the controller 402 may receive the input data IN, e.g. an input digital or analogue signal, and derive suitable timings for the switch control signals so as to provide the desired PWM encoding. For example the input data could be compared to a reference cyclic waveform or incrementing count value to determine the duration of the first period as will be understood by one skilled in the art. In some embodiments however the input data could be input to a PWM encoder 403 which generates suitable control signals for the switch controller 402. This may allow a single PWM encoder to be used to provide control signals for a plurality of modulators 208 as will be discussed in more detail below.

It will be understood however that FIG. 4 illustrates just one possible arrangement for a modulator and other modulators may be implemented, for instance comprising different switch configurations.

Referring back to FIG. 2, the modulated differential set output from the modulator 208 may be provided to an accumulator 209. The accumulator 209 may comprise a differential integrator configured to integrate the differential current over a predefined time period, e.g. the PWM cycle period. In some implementations the accumulator 209 may be configured to provide an output value indicative of the integrated output value.

As indicated in FIG. 2, in some embodiments the modulated set output $I_{P1M}$ and $I_{N1M}$ from one modulator 208-1 may be combined with the modulated set output $I_{P2M}$ and $I_{N2M}$ from at least one other modulator 208-2 to form a group output $I_{PMG}$ and $I_{PNG}$ before being input to the accumulator. As mentioned the average current output from each modulator over the relevant PWM period will be proportional to the product of the relevant weight value stored in the set 205 of memory cells and the relevant input data. Combining the differential current signals from each of a group of sets, will thus provide a differential current signal $I_{PMG}$ and $I_{NMG}$ for the group, where the average current will be equal to the combined average current from each set of the group. Conveniently the PWM periods of each of the modulators 208 may be the same as one another and synchronised to the same clock signal. The combined current signal, i.e. group output, will thus provide a differential current signal $I_{PMG}$ and $I_{NMG}$, which is equivalent to the sum of the appropriated weighted input data, in similar fashion to a given output of the crossbar array described above with reference to FIG. 1.

In some embodiments the accumulator 209 may provide an output which is indicative of the received differential current signal. The output may be an analogue signal, for instance an analogue voltage or a digital output value.

In some implementations, where a computing circuit 200 such as illustrated in FIG. 2 is used as part of an artificial neural network (ANN), the combined sum of the weighted data values, i.e. the differential-current group output $I_{PMG}/I_{NMG}$, may be processed according to a non-linear function, e.g. an activation function may be applied. In some instances the accumulator 209 may output a value to be processed according to an activation function by some downstream processing. In some embodiments however the non-linear function may be applied by the accumulator 209. Thus a non-linear function generator 210 may apply a suitable non-linear function to the accumulator.

Figure 6A:
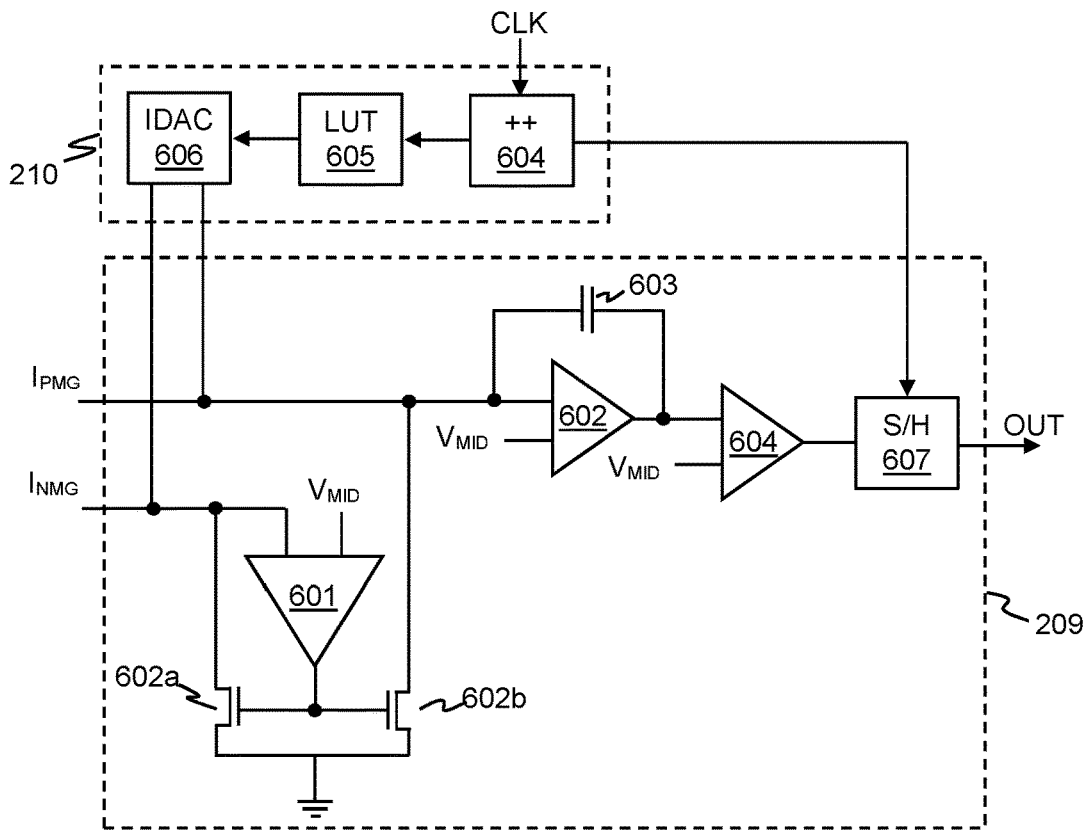
FIGS. 6a and 6b illustrate two examples of accumulator circuits with a non-linear function generator.

FIG. 6a illustrates one example of a suitable accumulator 209 that may be implemented with a non-linear function, although again it will be understood that the accumulator may be implemented in a number of different ways. During a first phase, the accumulator 209 receives the modulated group input currents $I_{PMG}$ and $I_{NMG}$ representing the weighted sum of the input values.

Amplifier 601 drives the common controlling gate node of matched transistors 602a and 602b to maintain the voltage of the input node receiving $I_{NMG}$ equal to a received midpoint voltage $V_{MID}$ (for example equal to the $V_{REF}$ referred to in respect of FIG. 4). The common controlling gate voltage of matched transistors 602a and 602b causes the drain currents of transistors 602a and 602b to be equal, so that transistor 602b sinks a current equal to $I_{NMG}$ through transistor 602b. This current is combined with current $I_{PMG}$ at a virtual earth (with voltage equal to $V_{MID}$) established by amplifier 602, essentially subtracting current $I_{NMG}$ from current $I_{PMG}$ and this difference current is integrated, by an integrator formed from amplifier 602 and capacitor 603, over the PWM cycle period, or possibly a plurality of PWM cycle periods if the same data input is maintained. Thus the accumulator integrates the differential current group output from a said group over a predefined time period.

To establish the virtual earth at the input to amplifier 602, the circuit may comprise some d.c. feedback path (e.g. a high value resistance or a weak current source controlled by the output of 602) or preferably a reset switch across the feedback capacitor to set the voltage on the input of amplifier 602 at the start of each PWM cycle period.

In some implementations, if non-linear processing were not required, the output of the amplifier 602 could be sampled and output at the end of the PWM cycle period so as to provide a data output indicative of the weighted sum of the input data values.

However, to enable a non-linear function to be applied, the accumulator 209 may subsequently be operable in a second phase, during which the input currents $I_{PMG}$ and $I_{NMG}$ are stopped, e.g. by the upstream modulators 208. During the second phase, the non-linear generator 210 may generate a differential current signal having a desired non-linear function. In the embodiments illustrated in FIG. 6 the non-linear function generator comprises a counter 604 which increments according to a received clock signal. The count value is input to a look-up table 605 or similar to determine a target current for that count value. In this way the target current evolves over time based according to a desired transfer function. The target current value is supplied to a current-mode digital to analogue converter (IDAC) 604 with a differential output to provide the corresponding current to the target current value. The IDAC, in some embodiments, may receive current from the current sources 207 of the set of current sources and switchably connect the current sources as required, according to the target current value. The current from the IDAC is supplied to charge or discharge the integrator capacitor 603 as appropriate. The count value from the counter 604 is also provided to a sample and hold element 607. A comparator 604 compares the output of the integrator with the defined midpoint voltage and toggles the sample and hold element 607 to output the present count value when the integrator capacitor is effectively charged/discharged back to the midpoint voltage level.

Thus, in the first phase the integrator capacitor 603 is effectively charged or discharged from a quiescent value to a value that depends on the weighted sum of the data inputs. In the second phase the capacitor is discharged or charged back to the quiescent value (in this case $V_{MID}$) according to the defined non-linear function and the accumulator outputs a count value, i.e. a digital value, indicative of the time required to discharge the integrator. This enables a computing circuit such as may be used to implement an ANN. In effect, in the first phase the accumulator receives and integrates the differential current group output from a said group over the predefined time period, e.g. the PWM cycle period. In the second phase the accumulator receives and integrates the current output from non-linear function generator and determines the duration from the start of the second phase until the integrated current in the second phase has the same magnitude as the integrated current in the first phase, which in this example is achieved by charging and discharging the same storage element, e.g. capacitor.

Figure 6B:
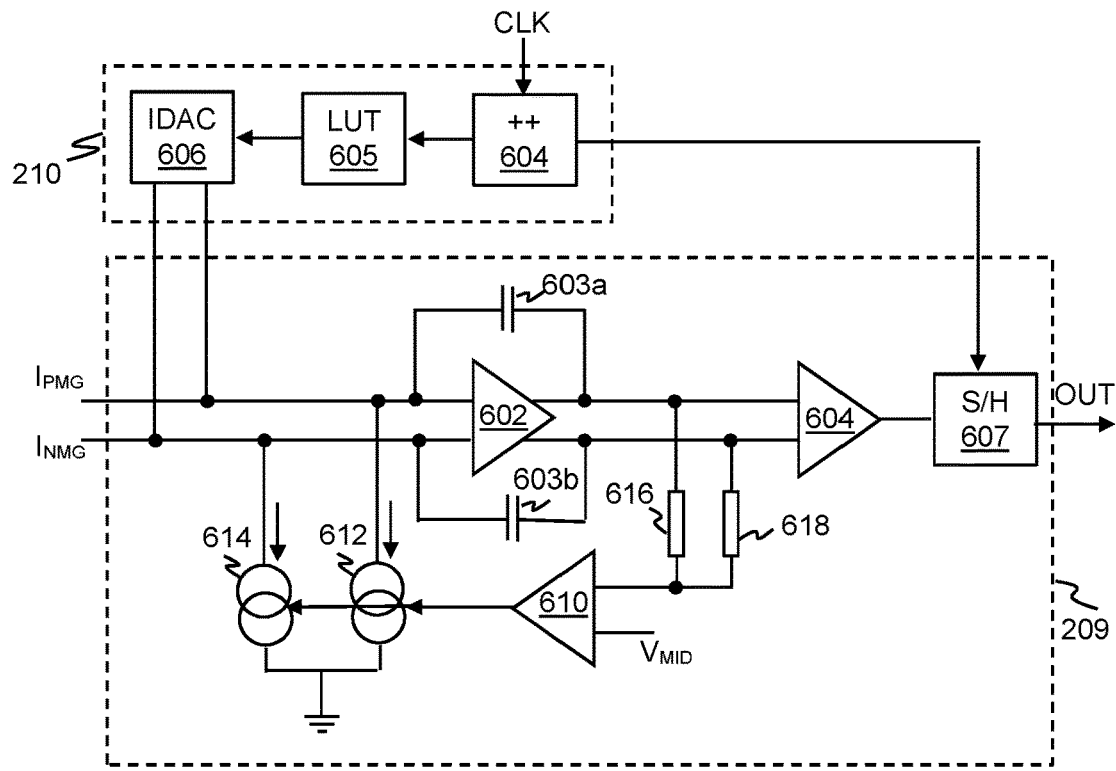

FIG. 6b illustrates an alternative arrangement where a fully differential integrator is implemented by differential amplifier 602 and capacitors 603a and 603b. In this example, to stabilise the common mode voltage for amplifier 602, the outputs are connected via resistors 616 and 618 to develop the common mode component of the output at an input to amplifier 610, which also receives the desired midpoint voltage $V_{MID}$. This auxiliary amplifier 610 stabilises the common mode of the output by controlling equal current sources 612 and 614 that source/sink current to the input nodes of amplifier 610. The auxiliary amplifier 601 only affects the common mode component via feedback and does not vary the differential signal component, and thus may be simpler than the amplifier 601 illustrated in FIG. 6a, with consequential size and/or power savings. The fully differential accumulator of FIG. 6b may also be less sensitive to external influence than that shown in FIG. 6a. In operation the accumulator of FIG. 6b may operate in two phases so as to apply a non-linear function from non-linear function generator 210 in a similar manner as discussed in relation to FIG. 6a.

Figure 7:
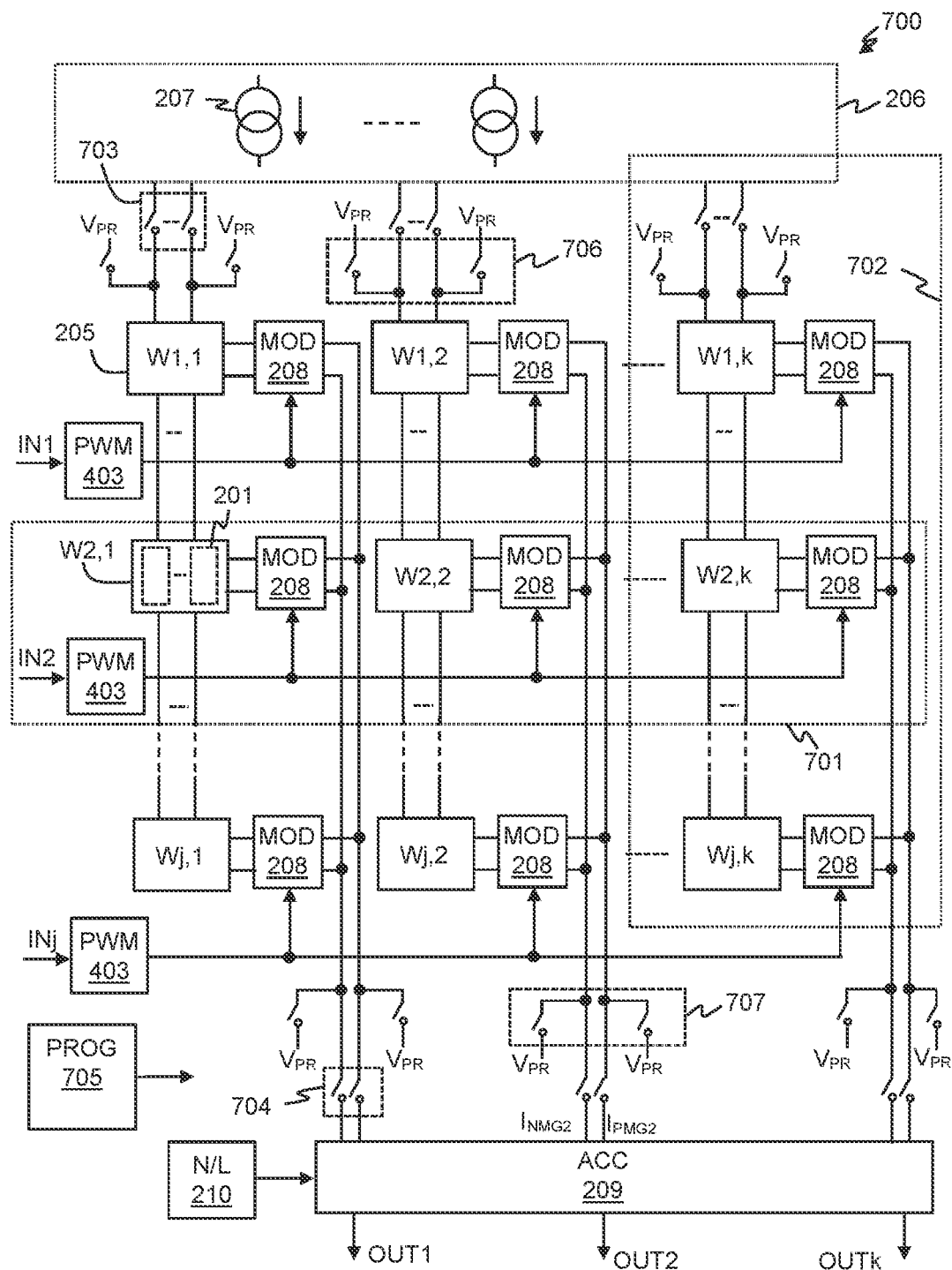
FIG. 7 illustrates another example of a computing circuit according to an embodiment.

FIG. 7 illustrates one example of a computing circuit having a plurality of sets of memory cells arranged in a crossbar array type arrangement. In FIG. 7 similar components to those described previously are identified by the same reference numerals.

FIG. 7 illustrates an array comprising a plurality of rows 701 and columns 702, in this instance a number of rows equal to j and a number of columns equal to k. In this example the number of rows correspond to the number of possible data inputs to the array and the number of columns corresponds to number of possible data outputs from the array. It should be understood however that the terms rows and columns are used for convenience only for the illustration of FIG. 7 and other arrangements are possible. In this example each column 702 is configured to generate a signal corresponding to the combination of the product of each of the inputs IN1 to INj with a corresponding weight value, i.e. W1,m to Wj,m for the mth column. The columns, in this example, thus represent groups of sets, where the modulated set output from each set in the group is combined with the others to form a group dot product output ΣINi·Wi,m (as a differential current signal, e.g. $I_{PMG2}/I_{NMG2}$) which is processed by the accumulator to provide a respective accumulator output OUTm (e.g. OUT1). There are a plurality of groups (equal to the number of row elements) to allow for the data inputs to be processed with different weight values.

In this example, each column thus comprises a group of j sets of memory cells for storing and outputting the multilevel weight values. Each set 205 of memory cells may comprise a number N of memory cells 201 with their cell outputs connected together as described previously so as to provide a combined output for the set. Respective inputs of corresponding memory cells in different sets may be coupled together, e.g. in series as illustrated, so that corresponding memory cells of the different sets, e.g. the LSBs of each set, receive and share the same current from the set 206 of current sources.

The number of memory cells 201 in each set 205 may depend on a desired resolution for the weight values. For instance, if the defined currents provided to the different memory cells in a set are binary weighted and a 6-bit resolution for the weight values is required there may be six memory cells in each set. As noted above in some embodiments there may be a respective current source for each memory cell in a set, or in some embodiments some memory cells in a set may receive and share current from the same current source.

In some embodiments the series 206 of current sources may be configured so as to provide sufficient current for all of the columns of the array simultaneously. In some embodiments, however, at least some columns of the array, e.g. groups of sets, could be operated on a time-division basis such that different columns could be operated at different times. In which case at least some current sources 207 of the series 206 of current sources could be coupled to different columns at different times, for example by column select switches 703.

In operation, defined input currents are provided to the sets 205 of memory cells in the columns. Each set 205 of memory cells in the column will thus output a differential current set output depending on the stored weight value as discussed previously. The differential current set output signals are modulated by modulators 208 associated with each row 701 to provide corresponding modulated set outputs.

In the example of FIG. 7, there is a modulator 208 for each set 205 of memory cells in a row. However there is a single PWM encoder 403 for that row, which receives the data input for that row and generates suitable control signals for each of the modulators 208. This arrangement would allow the input data for a row to be processed simultaneously with the relevant weight values for all of the sets of memory cells in that row. As noted previously however, in some arrangements the columns or groups may be operated in a time division manner, e.g. to reduce the number of current sources 207 required. In this case, a single modulator 208 of a row may be shared between the different columns in a similar time division manner.

Within a column or group of sets, the modulated signals from each row element, i.e. set 205 of memory cells, may be combined and supplied to an accumulator block 209 as a group output, e.g. $I_{PMG2}/I_{NMG2}$ to provide a respective accumulator output, e.g. OUT2. When multiple columns are active simultaneously there may be a suitable accumulator, such as illustrated in FIG. 6, for each active column. If the columns are activated in a time-division manner however the same accumulator may be used with different columns in a similar time-division way, and thus column select switches 704 may be used to couple the active column to the accumulator 209.

The matrix array 700 can thus process up to j data inputs with a j by k matrix of multilevel weight values to provide k outputs, each output corresponding to a weighted combination of the data inputs. The array 700 may be arranged to operate with at least some, or possibly all, columns operating simultaneously. However to possibly reduce the number of current sources and/or accumulators required, at least some columns may be operated in a time-division-multiplexed manner.

The sets 205 of memory cells 201 thus operate to both act as a memory for storing the weight values but also form part of the computing circuitry. This can allow for relatively low power and/or low latency operation and can be relatively efficient in terms of circuit area.

In order to program suitable data values in the memory cells, a programming controller 705 may be configured, in a write mode of operation, to control the application of suitable programming pulses to the memory cells 201. To be able to program the individual memristors of a memory cell 201 it is desirable to able to control the voltage across that individual memristor to a desired level, whilst ensuring that a programming threshold is not inadvertently applied to an unintended memristor. In the example of FIG. 7 there is a set of first column programming switches 706 for each column for selectively coupling the first electrodes of each memory cell 201 of that column to a programming voltage $V_{PR}$, which may be controllably selected to be a positive or negative voltage depending on the programming required. By selective control of the column programming switches 706, a desired voltage can be applied to one side of a desired memory cell, and all corresponding memory cells of the sets in that column. To provide a suitable voltage for the other side of the memristor the positive and negative electrodes $401_P$ and $401_N$ may also be coupled, by a set of second column programming switches 707 to an appropriate programming voltage. To ensure the memristors of the correct row are programmed, the modulators 208 of each row may be controlled by the programming controller 705 so as to make the connection for that row and to disconnect all other rows. This allows each memristor of each memory cell to be independently programmed to the desired state with a relatively low number of programming switches 706 and 707, which also keeps the circuit area small.

Figure 8:
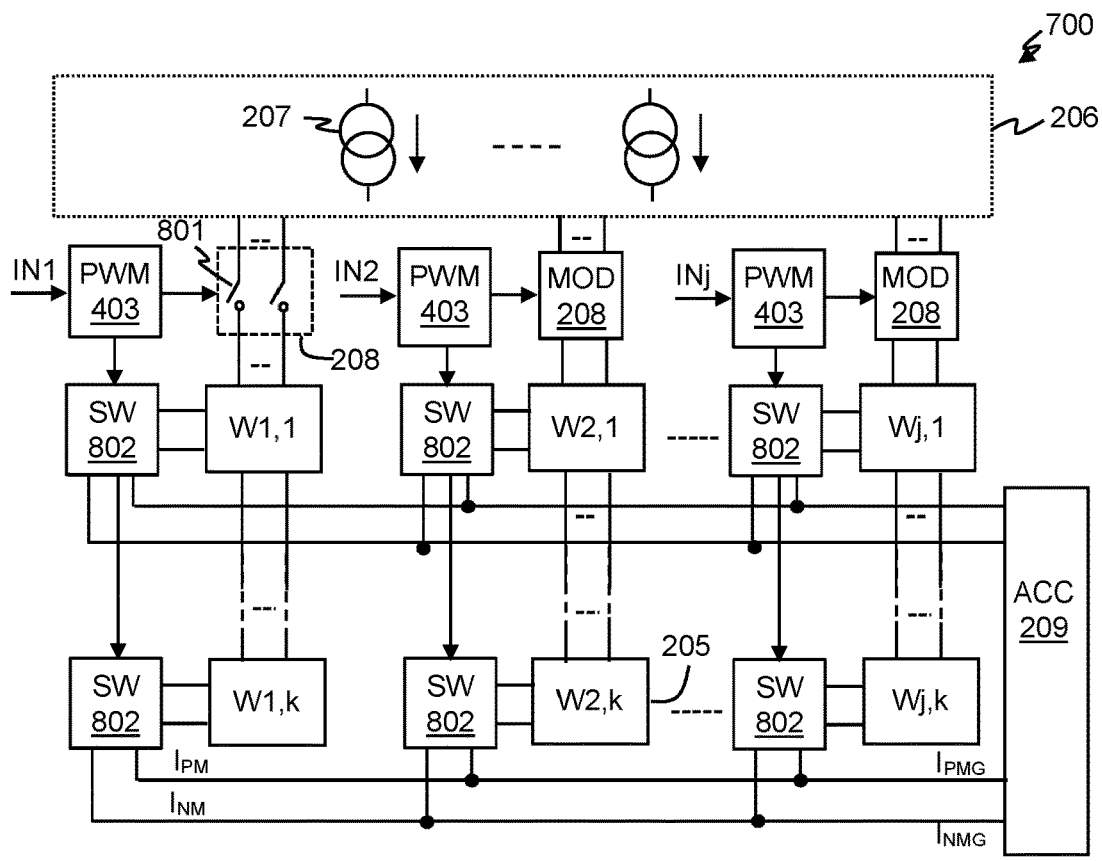
FIG. 8 illustrates a further example of a computing circuit.

It should be noted that the discussion above has focused on a set 205 of memory cells being used to store a multibit data value and output a set output current signal proportional to that data value, which can then be modulated by modulator 208. It would equally be possible however to apply a modulation, based on the input data, to the defined current input to the memory cells of the set. FIG. 8 illustrates one example where the PWM modulation is applied to the defined current, supplied from the set 206 of current sources, before the current is applied to a set 205 of memory cells. In this instance the modulator 208 may simply comprise a set of switches 801, for selectively connecting each first electrode of a memory cell 201 to a current source 207 of the set 206 of current sources. The set of switches 801 are controlled by PWM encoder 403. Each switch 801 may be closed for the first time period T1, i.e. for a proportion of the PWM cycle period based on the magnitude of the input signal, and opened for the rest of the duty cycle, i.e. for the period T2, so as to stop the supply of current. Alternatively, instead of switches, the current sources 207 could be enabled for the period T1 and disabled for the period T2. The result in either case is that the average current supplied to the memory cell during the PWM cycle period is proportional to the magnitude of the input data. Each memory cell 201 of the set 205 of N connected memory cells will steer this current to the positive and negative electrodes 203$_P$ and 203$_N$ in a similar way as discussed previously and thus the differential output current from the set will be proportional to the weight value and also the magnitude of the input data. Thus the modulated set output is provided by modulating the input current to the set.

However, the modulation of the input current in this way does not allow for a difference in modulation based on the polarity of the input data. Thus to allow for different polarities of input data, the output from a set 205 of memory cells may be selectively inverted based on the polarity of the input data. A set of switches 802, for example the output path switch arrangement of switches S1AP, S1AN, S1BP and S1BN of FIG. 4, may be arranged at the output of a set 205 of memory cells to selectively invert the output signals as required.

The first electrodes of corresponding memory cells 201 of the sets 205 of memory cells may be connected together to receive the same input current in a similar manner as discussed above. In this example however the current is modulated according to a given data input and thus the sets 205 that receive the same modulated current should correspond to the different weight values to be applied to that data input. In the example of FIG. 8, the same modulated current is applied to sets 205 of memory cells in a column and thus a column represents a data input. In this case the outputs from each corresponding column element in a row are combined together and supplied to the accumulator 209. In other words, in this example, the sets of memory cells which form a group and provide a group output $I_{PMG}/I_{NMG}$ for the accumulator would be the sets in a row.

Figure 9:
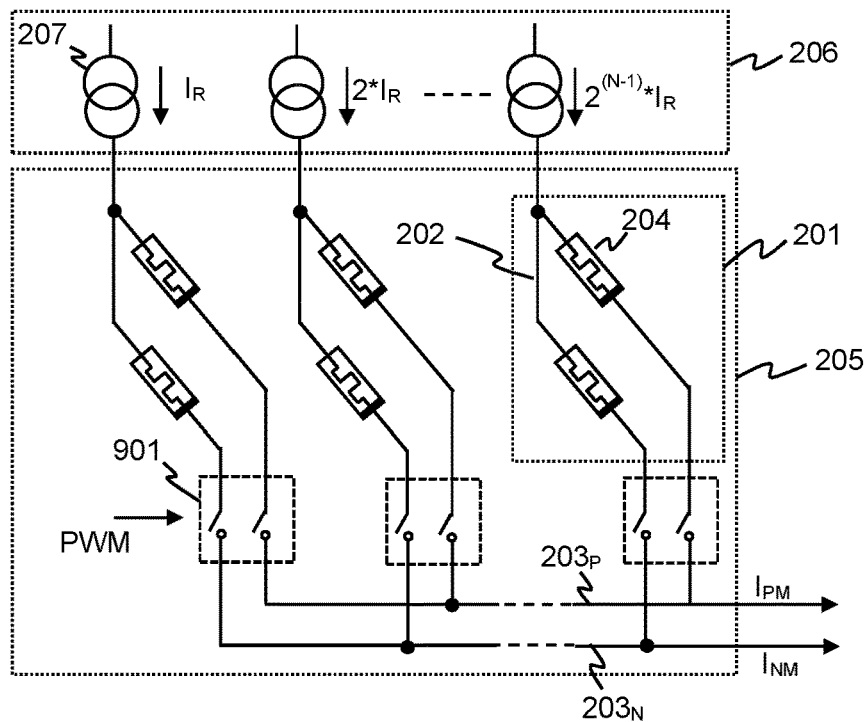
FIG. 9 illustrates an example of a set of memory cells with PWM modulation for each memory cell.

In another variant the time-encoding modulation, e.g. PWM modulation, could be applied to the output of each individual memory cell of a cell individually. FIG. 9 illustrates an example of a set 205 of memory cells where each individual memory cell 201 has an associated set of switches 901 which may be switched according to a PWM control signal. This may allow smaller switches to be implemented as the current through each switch is lower. Again however there may be a need to be able to swap the outputs to encode input data of different polarity. In any case the output of the set would be a modulated set output.

The discussion above has focused on binary encoding. For binary encoding the defined currents supplied to the different memory cells of a set may be binary weighted and each memory cell may be switched to one of two different cell states.

In some embodiments however a different encoding scheme may be used. In particular, in some embodiments, a ternary coding scheme may be used. The ternary coding may be implemented by programming a memory cell to one of at least three different cell states, including a cell state where both memristors of the memory cell are programmed to the same resistance state, i.e. both memristors are programmed to the high resistance state or both memristors are programmed to the high resistance state.

Thus a memory cell may be programmed to any of at least a first cell state, a second cell state or a third cell state. In the first cell state the memristor connecting the first electrode 202 to the positive electrode 203$_P$ may be programmed to the low resistance state and the memristor connecting the first electrode 202 to the negative electrode 203$_N$ may be programmed to the high resistance state. The second cell state may have the resistance states of the memristors swapped, i.e. the memristor connecting the first electrode 202 to the positive electrode 203$_P$ is programmed to the high resistance state and the memristor connecting the first electrode 202 to the negative electrode 203$_N$ is programmed to the low resistance state. Referring back to FIG. 3, the first and second cell states may thus be seen as the cell state shown on the left and right hand side of FIG. 3 respectively. According to equation 3, the first and second cell states provide differential current equal to $+I_R \cdot A_R$ and $-I_R \cdot A_R$ respectively (assuming that $I_R$ is the total current steered through the memristors of that memory cell). The first and second cell states can thus be seen as encoding data values of +1 and −1 respectively, in a similar manner as the binary encoding discussed previously. In addition however the memory cell may be switched to a third cell state, in which both memristors are switched to the same resistance state, say the high resistance state. In this case the current $I_R$ which is steered through the memristors of the cell will be divided substantially equally between the two memristors. The differential current contribution will thus be substantially zero. The third state will thus represent a zero state.

In this case the defined currents supplied to the different memory cells 201 of the set 205 of N connected memory cells may be ternary weighted, i.e. such that the defined current supplied to one memory cell differs from the defined current supplied to another memory cell of the set by a factor of 3. Consider for example that the set 205 comprises three memory cells which are configured to receive defined currents of $I_R$, $3I_R$ and $9I_R$ respectively. By selectively programming the memory cells into the first, second or third cell states, the differential output current from the set 205 of memory cells may take any of twenty-seven different values between $+13I_R$ to $-13I_R$ in increments of $I_R$. Use of ternary encoding thus allows for a given resolution of the stored data values to be achieved with fewer memory cells in a set than with the binary coding discussed above, which can reduce the overall number of memory cells in an array.

A memory cell which is programmed to the third state will, however, exhibit a different overall effective resistance than a memory cell which is programmed to either of the first cell state or the second cell state. This can mean that where multiple memory cells are connected in series to receive current from the same current source, a memory cell programmed to the third cell state may draw less current than a memory cell which is programmed to the first or second cell states.

Referring back to FIG. 2, this figure illustrates that a memory cell of the set 205-1 may be coupled together with a memory cell of the set 205-2 to the same current source 207 to share a define current $I_R$. Consider that the memory cell of the set 205-1 is programmed to one of the first and second cell states. If the memory cell of the set 205-2 was also programmed to one of the first and second cell states, then the effective resistance of each memory cell would be substantially the same. In this case each memory cell would effectively steer a current equal to $I_R/2$ and the differential current output from the memory cell would be given by equation 2, but with a factor of a half. If, however, the memory cell of set 205-2 was then programmed into the third cell state, with both its memristors in the high resistance state, then the effective resistance of that memory cell would increase. This would result in less current passing through that memory cell and more current passing through the memory cell of set 205-1, which would result in a change in the differential current output from the memory cell of set 205-1.

Thus if a plurality of memory cells are connected to receive current, in use, from the same current source at the same time, and each of the memory cells is programmed to one of the first, second or third cell states, then the differential current output from a memory cell in one of the first or second states, e.g. the +1 or −1 states, will vary depending on how many memory cells are programmed into the third cell state, i.e. the 0 state with both memristor sets to the high resistance state.

To address this issue a fourth cell state, with both memristors in the low resistance state, may be used as an alternative zero state. A memory cell may thus be programmed to a zero data value by selectively programming it to the third cell state, with both memristors in the high resistance state, or to the fourth cell state, with both memristors in the low resistance state. Programming both memristors of a memory cell to the low resistance state will also result in substantially the same current flowing to the positive and negative electrodes of that memory cell and hence provide a zero differential output current.

A memory cell programmed to the fourth cell state, with both memristors in the low resistance state, may thus exhibit a lower effective resistance than a memory cell in either of the first state or second cell states, and thus may take more current that a memory cell in the first cell state or second cell state. Again, switching a memory cell from the first or second cell state to the fourth cell state would result in a variation in current to other memory cells connected in series. However the lower resistance of memory cells in the fourth cell state may be used to compensate for the higher resistance of memory cells in the third state.

If a plurality of memory cells are connected together to receive current, in use, from the same current source and each of the memory cells is programmed to one of the first, second, third or fourth cell states, with the number of memory cells in the third cell state being equal to the number of memory cells in the fourth cell state, then the differential current output from a memory cell in the first or second cell states would be the same as if all memory cells were in the first or second cell states.

Referring to FIG. 7, if such a ternary coding scheme were used, the programming controller 705 may therefore be configured so as to control programming of the sets of memory cells within a column so that the number of memory cells connected, in use, to the same current source which are programmed to the third cell state differs from the number of memory cells programmed to the fourth cell state by less than a defined amount. For instance the programming controller 705 may be configured to program the memory cells so as to minimise any difference in numbers of memory cells in the third cell state and the fourth cell state. If the relevant memory cells that, in use, receive current from the same current source are to be programmed to data values that do not include any zero values then all memory cells will be programmed to the first +1 cell state or the second −1 cell state anyway. If there are an even number of zero values to be programmed then half of the relevant memory cells may be programmed to the third cell state with the remaining half programmed to the fourth cell state, so there is no difference in the numbers of memory cells in the third and fourth cell states. If there are an odd number of zero values to be programmed, then the memory cells may be programmed such that is one more instance of the third cell state than the fourth cell state or vice versa, so as to minimise the effect of any unbalance. Alternatively, in some embodiments the array may be configured such that there is an additional set of memory cells connected to each column so there is one more set in each column than is required for j input data values, i.e. each column may comprise j+1 sets of the memory cells. The positive and negative second electrodes of the additional memory cells may be connected to a reference voltage, so the additional set of memory cells draws current, but does not contribute to combined differential output current from the column. The additional set of memory cells can thus be seen as a set of dummy cells. Nevertheless the current from the current reference will be divided between all the sets, i.e. including the additional j+1 set. If the number of zero values to be programmed in the relevant memory cells of the j sets is even, the relevant memory cell of the additional j+1 may be programmed to the first cell state or second cell state. If however the number of zero values to be programmed in the relevant memory cells of the j sets is odd, the additional j+1 may be programmed to the third cell state or fourth cell state as appropriate so as to provide parity between the number of third cell states and fourth cell states. In effect the memory cells of the additional dummy set can be set to a zero state, to ensure an even number of zero states in the j+1 sets if required, or otherwise could be set to a +1 or −1 state.

The discussion above has focused on the use of a pair of memristors for each memory cell, where each memristor may be programmed to one of two different resistance levels to provide current steering. In general the memory cell has a common input, i.e. the first electrode 202, for receiving a defined input current, and first and second paths allowing current to flow from the common input to respective first and second cell outputs, i.e. the positive and negative second electrodes $203_P$ and $203_N$. Respective memristors are located in each of the first and second paths and programmed to a desired resistance state to provide desired current steering to the positive and negative output to represent a desired value. As discussed above, with memristors that can be programmed to one of two different resistance states, the memory cell can be programmed to a first cell state or a second cell state to preferentially steer current to one output or the other, e.g. to provide +1 and −1 cell states. For binary encoding, each memory cell may be programmed to one of the first or second cell states. To allow for ternary encoding the memristors in each path could be programmed to the same resistance state, i.e. the third cell state or fourth cell state, so as to steer current equally to the positive and negative outputs of the cell.

In some embodiments, the memristors in the first and second paths may be programmable to other values of resistance so as to provide current steering in other ratios. For instance the memristors could be programmable to a high resistance state with a resistance $R_H$ or a low resistance state with a resistance $R_L$ in a similar fashion as described above. In addition the memristor may be programmable to at least one intermediate value with a resistance $R_I$. To provide the greatest differential current the memory cell could be switched to the first or second cell states described above with one memristor in the high resistance state $R_H$ and the other memristor in the low resistance state $R_L$. As discussed with reference to equations 2 and 3, this will result in a differential current component proportional to $\pm I_R \cdot A_R$ (if $I_R$ is the total current steered via the first and second paths). To provide a lower, but non zero, differential current, one memristor could be switched to one of the high resistance state $R_H$ or the low resistance state $R_L$ and the other memristor could be switched to the intermediate resistance state $R_I$. If, for example, the memristor in the first path were in the intermediate resistance state $R_I$, with the memristor in the second path in the high resistance state $R_H$, current would be preferentially steered to the positive cell output electrode $203_P$ but the magnitude of the differential current will be lower than in the first cell state.

It will be noted however that if a memristor in one path were switched from the high resistance state or the low resistance state to the intermediate resistance state $R_I$, this would alter the overall resistance of the memory cell, which may be disadvantageous for the reasons described above. Thus it may be preferable that each memristor may be programmable to the high resistance state $R_H$ or the low resistance state $R_L$ or one of two alternative resistances state $R_{A1}$ or $R_{A2}$. The memory cell may then be operable in at least the first and second cell states discussed above, or first or second additional cell states in which one memristor is in the resistance state $R_{A1}$ and the other memristor is in the resistance state $R_{A2}$.

In this case the differential current will be given by:

$$I_P - I_N = \pm I_R \cdot [(R_{A1} - R_{A2})/(R_{A1} + R_{A2})] \quad \text{Eqn. (5)}$$

assuming no other resistances in the first and second paths. The resistance values $R_{A1}$ and $R_{A2}$ may be configured with respect to the values $R_H$ and $R_L$, possibly together with the value of any other resistances in the first and second paths, to provide a desired ratio of current in the first and second additional cell states compared to the first and second cell states, but to provide an overall memory cell resistance that is substantially the same in all of these cell states.

For example if the first and second cell states provide differential currents of magnitude $I_R \cdot A_R$, the first and second additional cell states may be configured to provide differential currents of magnitude $I_R \cdot A_R / 3$. In this case, by selectively programming the memory cell to cell state selected from the first cell state, second cell state, first additional cell state and second additional cell state, the memory cell can effectively to be programmed to a selected value from $\{+1, +\frac{1}{3}, -\frac{1}{3}, -1\}$.

The use of additional cell states in this way can allow for different current weightings to be applied to the defined currents applied to the different memory cells of a set.

For example, consider a set of two memory cells, each of which may be programmed, as discussed above, to a selected value from $\{+1, +\frac{1}{3}, -\frac{1}{3}, -1\}$. A weighted current of $3I_R$ may be provided to the memory cell representing the LSB of the set and a weighted current of $12I_R$ may be provided to the memory cell representing the MSB of the set. The differential current output from the MSB memory cell may thus be any of $+12I_R \cdot A_R$, $+4I_R \cdot A_R$, $-4I_R \cdot A_R$ or $-12I_R \cdot A_R$. The output from the MSB memory cell may be combined with the differential current output from the LSB memory cell which may be any of $+3I_R \cdot A_R$, $+1I_R \cdot A_R$, $-I_R \cdot A_R$ or $-3I_R \cdot A_R$. It will be understood that the combined current may thus take any of sixteen different values from $+15I_R \cdot A_R$ to $-15I_R \cdot A_R$ in steps of magnitude $2I_R \cdot A_R$.

The use of additional cell states that allow for different, non-zero, ratios of differential current output can thus provide each memory cell with a greater resolution, which means that a desired resolution for a weight value may be achieved from fewer memory cells in a set, which may decrease the number of current sources required and/or the number of memory cells required for a processing array.

The discussion above has described that the memristors may be programmed to the various different values. Memristors that can be selectively programmed to a desired value are available and may be used. It will be understood however that the current steering depends on the overall resistance/conductance of the first and second paths through the memory cell and in some embodiments the first and second paths may each comprise multiple programmable elements, e.g. multiple memristors in a desired configuration so as to allow the paths to be programmed to the desired resistance/conductance values.

Embodiments thus relate to computing circuitry comprising memory cells configured to receive a defined input current in use and having first and second memristors in first and second paths for steering the input current to a positive output or a negative output respectively. Such memory cells may be arranged or configurable in sets of a number N memory cells that can steer current to the same positive and negative outputs, where the defined currents that are input to different memory cells of the set differ from one another. Each memory cell may be programmed to store an individual digit of an N digit weight value stored by the set. In some embodiments the sets of memory cells may be binary encoded. In some embodiments the sets may be ternary encoded. The current input to, or output from, a set of memory cells may be time-encoded, for instance according to a PWM modulation, based on an input value, such that modulated differential current output from a set of memory cells has an average value, over the cycle period, that corresponds to the dot product of the input data value and the stored N digit weight value. A computing circuit may comprise an array of sets of memory cells and the modulated differential currents from a plurality of different sets of memory cells may be combined to form a sum of the relevant dot products. The combined differential current may be supplied to an accumulator. In some instances the computing circuit may be configured to process the sum of the relevant dot products according to a non-linear function. Such a computing array may form at least part of an ANN.

Computing circuitry according to the present embodiments may be relatively low power. Because of the ability for parallel processing of data without the need for multiple memory reads and memory writes the computing circuitry may be operable with relatively low latency, which may be particularly suitable for some applications, such as speech or speaker recognition for example.

Figure 10:
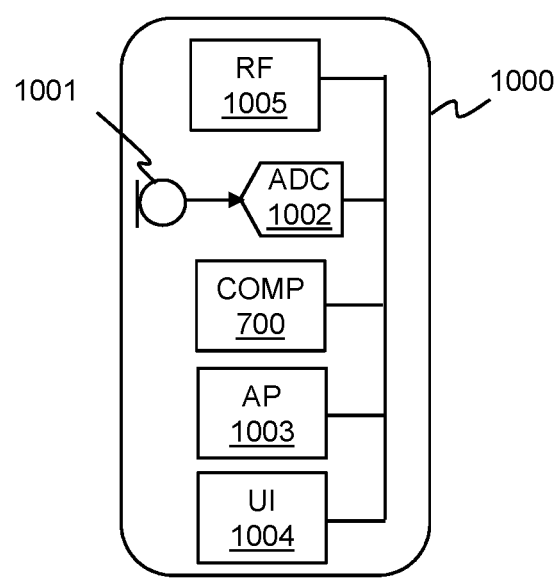
FIG. 10 illustrates an electronic device including computing circuitry according to an embodiment.

Computing circuitry according to embodiments may be implemented in an electronic device. FIG. 10 illustrates an electronic device 1000 comprising a computing circuit 700 such as described above. The electronic device may be a portable or battery powered device, for instance a tablet or laptop computer, or smartphone or smartwatch or the like, or a communications interface device such as a smart speaker or other smart listening device. The device may, in some instances, be a voice controlled or voice activated device. The device could be a domestic appliance. The device may have a microphone 1001 and an ADC 1002. In some instances the computing circuit may be operable to process audio data received via the microphone, e.g. for speech and/or speaker recognition. The device may comprise an applications processor (AP) 1003 and in some implementations the computing circuitry may be operable to process data received from the AP and/or to provide data to the AP. In some instances the operation of the computing circuit 700 may be configured by the AP 1003 in use. The device may have at least one other user interface 1004, e.g. for allowing text input and in some applications the computing circuit 700 may be operable to process data received via the UI 1004. The electronic device may also comprise an RF unit 1005 for sending and receiving data wirelessly, e.g. via WiFi™ or Bluetooth™. The computing circuitry 700 may be operable to process data received via the RF unit 1005 and/or to provide data to the RF unit 1005 for broadcast. In some embodiments the weight values to be stored in the memory cells may be received or updated via the RF unit 1005.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Computing circuitry comprising:
    a plurality of memory cells, each memory cell comprising:
    a first electrode for receiving an input current;
    positive and negative second electrodes for outputting a differential-current cell output;
    a first memristor in a first path connecting the first electrode to the positive second electrode; and
    a second memristor in a second path connecting the first electrode to the negative second electrode;
        wherein the plurality of memory cells are configured into one or more sets of memory cells, the memory cells of each said set being connected so as to provide a differential current set output that corresponds to a combination of the cell outputs of all of the memory cells of that set; and
        wherein, for each said set, at least some of the memory cells of that set are configured to receive a different input current to other memory cells of that set;
        further comprising at least one series of current sources, each series of current sources being configured to provide input currents for at least one set of memory cells.

2. Computing circuitry as claimed in claim 1 wherein, for each said set, each memory cell of that set is configured to receive a different input current to the other memory cells of that set.

3. Computing circuitry as claimed in claim 1 comprising at least one time encoding modulator operable to apply a time-encoding modulation based on an input data value to a said set of memory cells so as to provide a respective modulated set output for that set of memory cells, in which an average value of the modulated set output over a defined period is proportional to the magnitude of the input data value.

4. Computing circuitry as claimed in claim 3, wherein a said time encoding modulator is configured to apply a time-encoding modulation to a said set of memory cells by modulating at least one of:
the input current for each memory cell of that set of memory cells;
the cell output from each memory cell of that set of memory cells; and
the set output from that set of memory cells.

5. Computing circuitry as claimed in claim 3 comprising at least one group of a plurality of said sets of memory cells;
wherein, for each of said sets in a said group, a respective said time encoding modulator is operable to apply a time-encoding modulation based on a respective data input value; and
wherein the plurality of sets of memory cells in a group are connected so as to provide a differential current group output that corresponds to a combination of all of the modulated set outputs of the sets of memory cells of the group.

6. Computing circuitry as claimed in claim 5, wherein, for each set in a group, the first electrode for each memory cell in that set is connected to the first electrodes of corresponding memory cells in the other sets in that group.

7. Computing circuitry as claimed in claim 5 comprising a plurality of said groups, wherein the computing circuitry is configured such that, each of said sets of the group has a corresponding set in each of the other groups and the time encoding modulation applied to each corresponding set is based on the same input data value.

8. Computing circuitry as claimed in claim 7 comprising an accumulator operable to integrate the differential current group output from a said group over a predefined time period.

9. Computing circuitry as claimed in claim 8 comprising a non-linear function generator for applying a defined non-linear function to the accumulator wherein the non-linear function generator comprises a current mode digital to analogue converter configured to generate a current based on a target current control signal, wherein the target current control signal varies over time according to the predefined non-linear function.

10. Computing circuitry as claimed in claim 9 wherein the accumulator is configured to operate in a first phase and a second phase, wherein:
in the first phase the accumulator is configured to receive and integrate the differential current group output from a said group over a predefined time period; and
in the second phase the accumulator is configured to receive and integrate the current output from non-linear function generator and to determine a duration from the start of the second phase until the integrated current in the second phase has the same magnitude as the integrated current in the first phase;
wherein the accumulator is configured to output an accumulator output value based on said determined duration in the second phase.

11. Computing circuitry as claimed in claim 1 further comprising a programming controller for controlling programming of the plurality of memory cells such that, for each said set of memory cells, the differential current set output is proportional to a respective stored data value.

12. Computing circuitry as claimed in claim 11 wherein the programming controller is configured to program the memory cells according to a binary coding scheme and wherein the computing circuitry is configured such that the input currents provided to different memory cells of a said set of memory cells are binary weighted and wherein the programming controller is configured to program the memory cells to either of:
a first cell state, in the first memristor is programmed to a low resistance state and the second memristor is programmed to a high resistance state; or
a second cell state, in the first memristor is programmed to the resistance state and the second memristor is programmed to the low resistance state.

13. Computing circuitry comprising:
a plurality of memory cells, each memory cell comprising:
a first electrode for receiving an input current;
positive and negative second electrodes for outputting a differential-current cell output;
a first memristor in a first path connecting the first electrode to the positive second electrode; and
a second memristor in a second path connecting the first electrode to the negative second electrode;
wherein the plurality of memory cells are configured into one or more sets of memory cells, the memory cells of each said set being connected so as to provide a differential current set output that corresponds to a combination of the cell outputs of all of the memory cells of that set; and
wherein, for each said set, at least some of the memory cells of that set are configured to receive a different input current to other memory cells of that set; and
a programming controller for controlling programming of the plurality of memory cells such that, for each said set of memory cells, the differential current set output is proportional to a respective stored data value;
wherein the programming controller is configured to program the memory cells according to a ternary coding scheme and wherein the computing circuitry is configured such that the input currents provided to different memory cells of a said set of memory cells are ternary weighted.

14. Computing circuitry as claimed in claim 13 wherein the programming controller is configured to program the memory cells to any of:
a first cell state, in the first memristor is programmed to a low resistance state and the second memristor is programmed to a high resistance state;
a second cell state, in the first memristor is programmed to the resistance state and the second memristor is programmed to the low resistance state; or
a third cell state, in which both the first and second memristors are programmed to the same one of either the low resistance state or the high resistance state.

15. Computing circuitry as claimed in claim 14 wherein, in the third cell state both of the first and second memristors are programmed to the high resistance state, and the programming controller is configured such that each memory cell may be further controllably programmed to a fourth cell state, in which both the first and second memristors are programmed to the low resistance state.

16. Computing circuitry as claimed in claim 15 wherein, for any collection of memory cells which are connected to one another by their first electrodes, the programming controller is configured to program said collection of memory cells such that any imbalance in the number of instances of the third cell state and the fourth cell state is below a defined limit.

17. Computing circuitry as claimed in claim 11 wherein the programming controller is configured to program each memory cell to a selected one of at least:

a first cell state in which the first and second memristors are programmed such that the first and second paths have respective resistances so as to steer current from the first electrode to the positive and negative second electrodes to provide a differential current of a first polarity and a first magnitude with respect to the input current;

a second cell state in which the first and second memristors are programmed such that the first and second paths have respective resistances so as to steer current from the first electrode to the positive and negative second electrodes to provide a differential current of a second, opposite, polarity and the first magnitude with respect to the input current;

a first additional cell state in which the first and second memristors are programmed such that the first and second paths have respective resistances so as to steer current from the first electrode to the positive and negative second electrodes to provide a differential current of the first polarity and of a second magnitude with respect to the input current, where the second magnitude is a defined fraction of the first magnitude; and a second additional cell state in which the first and second memristors are programmed such that the first and second paths have respective resistances so as to steer current from the first electrode to the positive and negative second electrodes to provide a differential current of the second polarity and of the second magnitude with respect to the input current.

18. Computing circuitry as claimed in claim 1 wherein each memory cell further comprises one or more ballast resistances, each of the first and second memristors being coupled in series with at least one of said ballast resistances.

* * * * *